(12) United States Patent
Litz

(10) Patent No.: US 11,480,599 B2
(45) Date of Patent: Oct. 25, 2022

(54) MOTOR VEHICLE ELECTRIC SYSTEM COMPRISING A MONITORING OF INSULATION FOR SUPPLYING AN ENVIRONMENT SENSING SYSTEM

(71) Applicant: ZF Friedrichshafen AG, Friedrichshafen (DE)

(72) Inventor: Markus Litz, Friedrichshafen (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 287 days.

(21) Appl. No.: 16/525,301

(22) Filed: Jul. 29, 2019

(65) Prior Publication Data
US 2020/0041555 A1    Feb. 6, 2020

(30) Foreign Application Priority Data
Jul. 31, 2018    (DE) ............... 10 2018 212 767.0

(51) Int. Cl.
| | | |
|---|---|---|
| G01R 31/00 | (2006.01) | |
| G01R 27/18 | (2006.01) | |
| B60L 3/04 | (2006.01) | |
| B60W 30/095 | (2012.01) | |
| B60L 3/00 | (2019.01) | |

(52) U.S. Cl.
CPC ......... *G01R 31/006* (2013.01); *B60L 3/0069* (2013.01); *B60L 3/04* (2013.01); *B60W 30/0956* (2013.01); *G01R 27/18* (2013.01)

(58) Field of Classification Search
CPC . B60W 30/0956; G01R 27/18; G01R 27/025; G01R 31/06; G01R 31/52; G01R 31/14; B60L 3/0069; B60L 3/04
See application file for complete search history.

(56) References Cited

U.S. PATENT DOCUMENTS

| | | | | |
|---|---|---|---|---|
| 2003/0214306 | A1* | 11/2003 | Beutelschiess | B60L 58/34 324/511 |
| 2007/0008666 | A1* | 1/2007 | Morita | B60L 3/0069 361/42 |
| 2013/0106437 | A1* | 5/2013 | Herraiz | G01R 31/11 324/615 |
| 2014/0265560 | A1* | 9/2014 | Leehey | B60L 58/13 307/10.1 |
| 2015/0177308 | A1* | 6/2015 | Kullick | G01R 31/006 324/551 |

(Continued)

FOREIGN PATENT DOCUMENTS

| | | |
|---|---|---|
| DE | 10 2013 226 595 A1 | 6/2015 |
| DE | 10 2016 005 732 A1 | 11/2017 |

OTHER PUBLICATIONS

Office Action in DE 10 2018 212 767.0 dated Jul. 3, 2019 (10 pages).

(Continued)

*Primary Examiner* — Alvaro E Fortich
(74) *Attorney, Agent, or Firm* — Crowell & Moring LLP

(57) ABSTRACT

The present disclosure relates to a motor vehicle on-board network with a first voltage circuit for supplying electric power to an environment sensor system with a first electrical voltage, wherein an insulation monitor is provided for the first voltage circuit to monitor the insulation resistance of the first voltage circuit.

4 Claims, 3 Drawing Sheets

(56) References Cited

U.S. PATENT DOCUMENTS

| | | | |
|---|---|---|---|
| 2016/0252555 A1* | 9/2016 | Deumal Herraiz | G01R 35/00 |
| | | | 324/503 |
| 2017/0080804 A1* | 3/2017 | Albert | B60L 50/62 |
| 2018/0022218 A1* | 1/2018 | Watanuki | G01R 31/006 |
| | | | 324/503 |
| 2018/0136284 A1* | 5/2018 | Mayer | G01R 31/382 |
| 2019/0299970 A1* | 10/2019 | Money | B60W 30/18109 |

OTHER PUBLICATIONS

"Taxonomy and Definition for Terms Related to Driving Automation Systems for On-Road Motor Vehicles", *Surface Vehicle Recommended Practice* J3016, *SAE International*, Issued: Jan. 2014; Revised: Jun. 2018 (35 pages).

\* cited by examiner

MOTOR VEHICLE ELECTRIC SYSTEM COMPRISING A MONITORING OF INSULATION FOR SUPPLYING AN ENVIRONMENT SENSING SYSTEM

RELATED APPLICATIONS

This application claims priority from German Patent Application DE 10 2018 212 767.0, filed Jul. 31, 2018, the entirety of which is hereby incorporated by reference herein.

TECHNICAL FIELD

This disclosure relates to a motor vehicle on-board network with at least one voltage circuit for supplying electric power to an environment sensor system with an electric voltage.

BACKGROUND

Motor vehicle on-board networks with one voltage circuit for supplying electric power to an environment sensor system are already known per se. Ordinarily, the environment sensor system is supplied with electric power by means of the available low voltage, usually 12 or 24 volts.

Motor vehicle on-board networks are also known that have a high voltage circuit in addition to the low voltage circuit. The high voltage circuit is then used to supply electric power to a traction drive.

For example, from DE 10 2016 005 732 A1 an insulation monitor of a high voltage on-board network of an at least partially electrically driven vehicle is known.

SUMMARY

This disclosure addresses the problem of improving the state of the art.

These problems are solved by the subject matter specified in the main claims. Various embodiments can be inferred from the subsidiary claims.

Accordingly, a motor vehicle on-board network and a motor vehicle with such an on-board network are proposed.

The motor vehicle on-board network has a first voltage circuit for supplying electric power to an environment sensor system with a first electric voltage. This voltage can also be referred to as the operating voltage of this first voltage circuit. In addition, the motor vehicle on-board network has an insulation monitor for the first voltage circuit. The insulation monitor is used to monitor the insulation resistance of this first voltage circuit.

Through this use of the insulation monitor in the part of the motor vehicle on-board network that is also used to supply electric power to the environment sensor system, it is possible, without doubling security-critical components of the on-board network, to detect a possible power failure of the environment sensor system at an early stage. Thus, in the event of a failure, a motor vehicle equipped with this can be brought to a safe standstill in due time.

The insulation monitor has the task of monitoring the insulation resistance in the first voltage circuit. This occurs continually or at intervals. The insulation monitor can thus also be referred to as an insulation resistance monitoring device. In this connection, through the insulation monitor, the insulation resistance itself, or a variable related to it, can be determined, for example, by measurement. Hence it is possible and advantageous, but not absolutely necessary, that the insulation monitor determines the insulation resistance as a value in the SI-unit [Ω]. For the realization of the insulation monitor it is sufficient if it only determines an analog value for the insulation resistance, for example the associated electrical conductance in the SI-unit [S] or the intensity of an electric current related to the insulation resistance in the SI-unit [A].

In case the determined value of the insulation resistance or the related variable changes in a manner that is impermissibly great, the insulation monitor outputs a corresponding signal, for example, to a motor vehicle master computer. Such an impermissibly great change can be present when the determined value lies outside of a permissible range or when a difference between the currently determined value and a previously determined value lies outside of a permissible range. Preferably, the master computer decides on an appropriate reaction depending on the existing security risks. Hence, the master computer can for example safely stop the motor vehicle (high security risk) or output a message that a repair service is necessary (low security risk).

The environment sensor system is in particular a sensor system for monitoring the environment of the motor vehicles, in order to facilitate at least partially autonomous driving, in particular with an SAE level (SAE J3016) equal to or greater than 1. The environment sensor system can have at least one of the following sensor systems: LIDAR, RADAR, ultrasonic sensor, camera. As an alternative or in addition to such sensor systems, the environment sensor system can also have at least one other type of sensor system.

The first voltage circuit is preferably a low voltage circuit. Accordingly, an inherently conventional environment sensor system can be used in the first voltage circuit. A low voltage circuit here is understood as a voltage circuit that has a rated voltage of less than 60 volts. In particular, the rated voltage of the first voltage circuit can be 48 volts or 24 volts or 12 volts or 6 volts.

The first voltage circuit can be the only voltage circuit of the motor vehicle on-board net-work. However, in one possible embodiment the motor vehicle on-board network can also have precisely or at least one second voltage circuit with a second voltage along with the mentioned first voltage circuit. This second voltage circuit is then used to supply electric power to an electric traction drive with the second voltage. This second voltage can also be referred to as the operating voltage of the second voltage circuit. Such a traction drive typically has an electric machine, which provides a driving torque for the motor vehicle for vehicle propulsion. The motor vehicle is then a motor vehicle that can be electrically driven at least some of the time, for example such as a hybrid vehicle or an electric vehicle.

Preferably, the first voltage circuit is used to supply electric power to the environment sensor system and further electric components of the motor vehicles, for example such as lighting and/or a control unit, while the second voltage circuit is used exclusively for supplying electric power to the traction drive.

Preferably, the second voltage circuit is configured as a high voltage circuit. A high voltage circuit is understood to be a voltage circuit that has a rated voltage of more than 60 volts. In particular, the rated voltage of the second voltage circuit can be greater than 350 volts.

In one embodiment the second voltage circuit can have a second insulation monitor. This second insulation monitor can be independent from the insulation monitor of the first voltage circuit (first insulation monitor). The second insulation monitor then has the same task as the first insulation monitor, however, exclusively for the second voltage circuit.

Such a configuration of the motor vehicle on-board network is suitable especially when the two voltage circuits are not galvanically isolated from each other. As a result, the insulation resistance of both voltage circuits is monitored separately from each other by separate devices.

However, when the two voltage circuits are galvanically isolated from each other, in an alternative embodiment the insulation monitor can be used both to monitor the insulation resistance of the first voltage circuit, and also to monitor the insulation resistance of the second voltage circuit. Hence, a common device is provided for the insulation monitor of both voltage circuits. As a result, the insulation resistance of both voltage circuits can be jointly monitored and components for the insulation monitor can be economized.

In particular, the first and if applicable, the second voltage circuit can be DC voltage circuits. The electric operating voltage (first/second voltage) present therein is thus essentially a direct current voltage.

DETAILED DESCRIPTION

In the following, the disclosure will be explained in greater detail on the basis of the figures, from which further preferred embodiments and features can be inferred.

Figure 1:
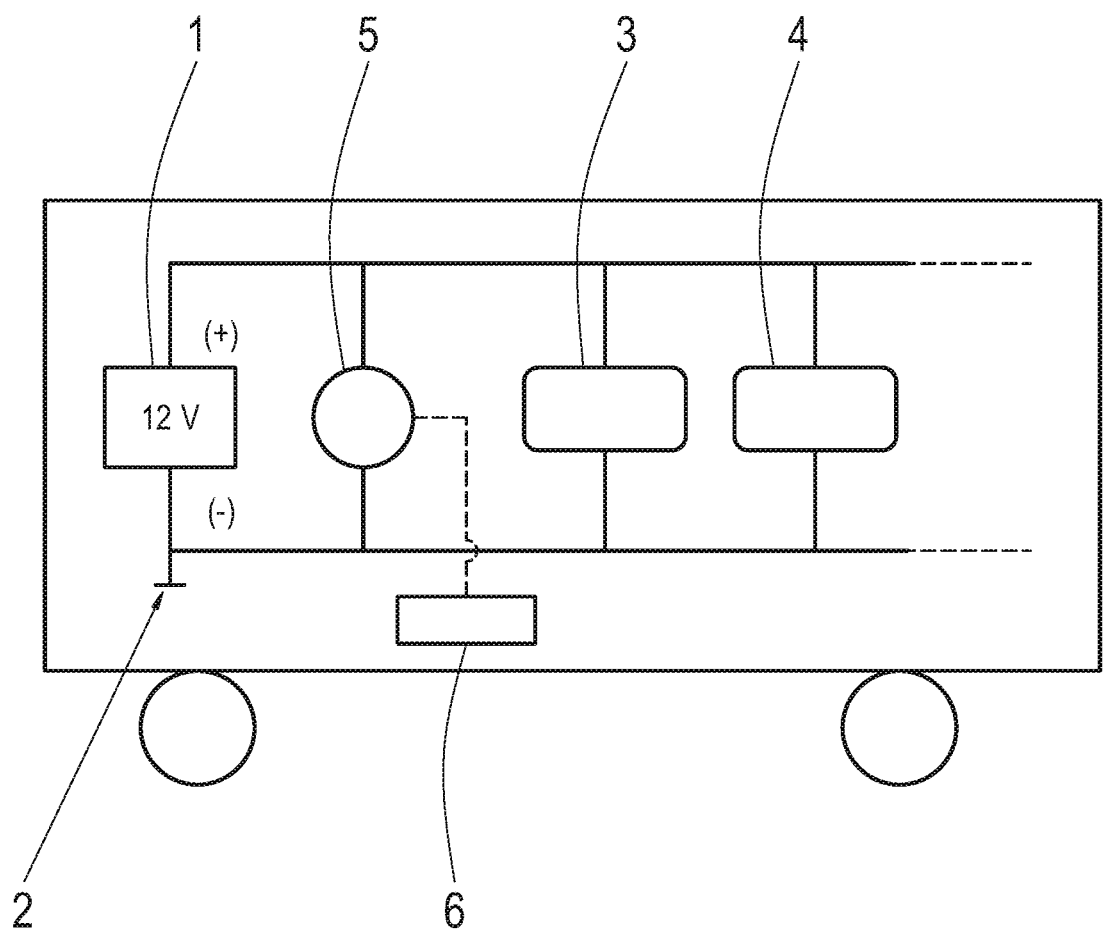
FIG. 1 shows a schematic representation of a motor vehicle.

FIG. 1 shows here in schematic representation a motor vehicle, for example an automobile or a truck. The motor vehicle has a motor vehicle on-board network. The on-board network has a voltage circuit, which is supplied from a voltage source 1 with an electric direct current voltage of, for example, 12 volts. It is a so-called low voltage circuit. However, different voltage levels in the low voltage range of less than 60 volts are likewise possible. The voltage source 1 can, for example, be an inherently known accumulator and/or a DC generator. One of the electric poles of the voltage source 1 is electrically coupled to a chassis 2 of the motor vehicle (as a rule, the negative "(−)" pole). Thus, the chassis 2 serves as an electrical ground.

The voltage circuit is used to supply electric power to at least one environment sensor system 3. For example, this can comprise or can be a LIDAR, RADAR or ultrasonic sensor or a camera. The environment sensor system 3 is thus electrically operated with the 12V direct current voltage of the voltage circuit. In addition, the voltage circuit can be used to supply electric power to at least one further electric component 4. For example, this can be a control unit or a light. Additional electric components can also be supplied with electric power by the voltage circuit. This is indicated in FIG. 1 by the dotted line to the right of component 4. The electric components 3, 4 supplied with electric power by the voltage circuit are electrically connected in parallel to each other, thus in each case, connected as electrical ground between the one pole (+) and the other pole (−) of the voltage source 1 or between the one electric pole (+) and the chassis 2.

In addition, the motor vehicle on-board network has an insulation monitor 5. This determines the insulation resistance or a related variable of the voltage circuit, for example by means of measurement. In case the value of the insulation resistance or the value of the related variable change in a manner that is impermissibly great, a corresponding signal is output from the insulation monitor 5 to a higher-level motor vehicle master computer 6. The motor vehicle master computer 6 then makes a decision about an appropriate reaction depending on the associated security risk. For example, in the event of a high security risk the motor vehicle master computer 6 can initiate a safe stop of the motor vehicle.

Figure 2:
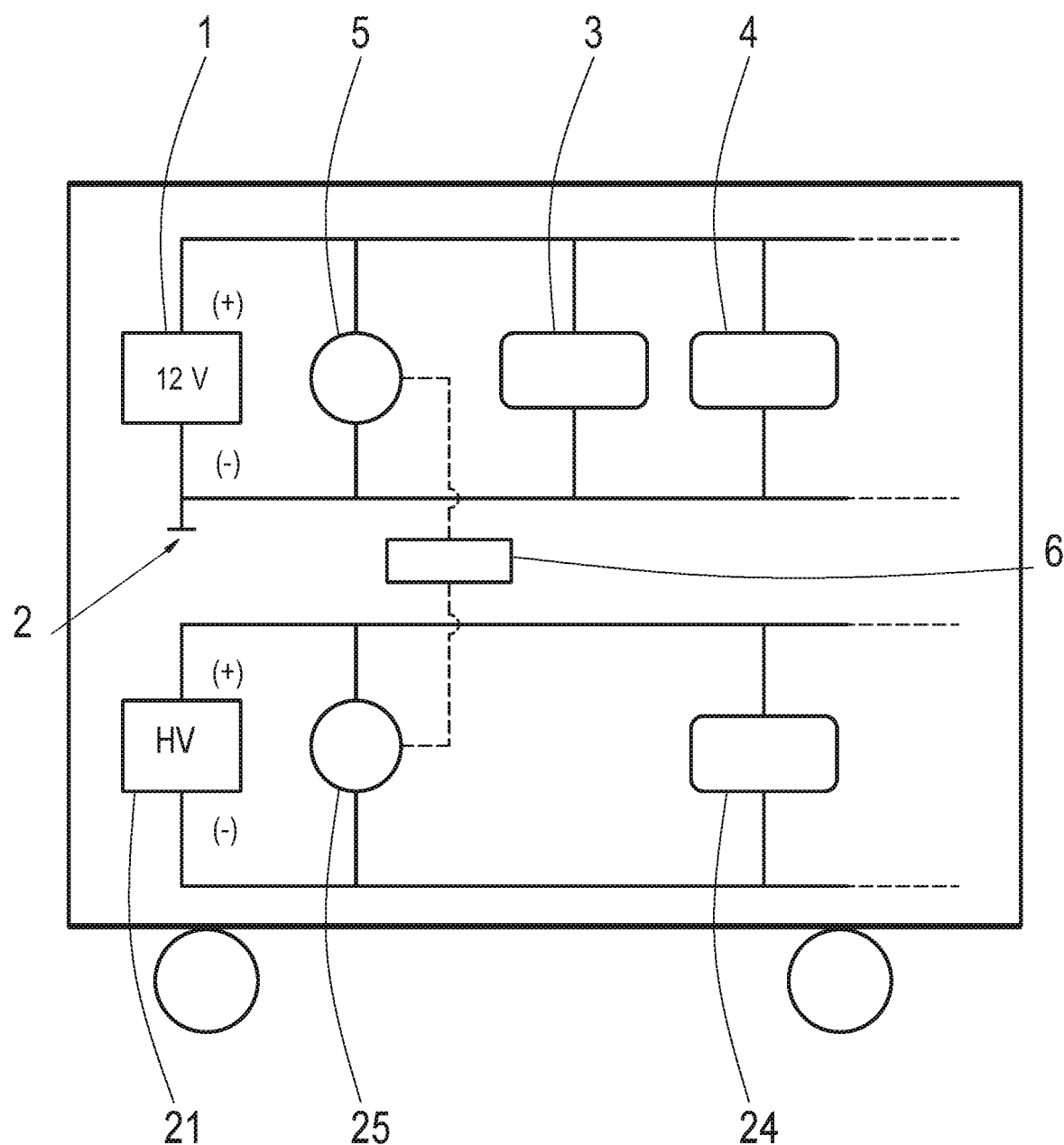
FIG. 2 shows another schematic representation of a motor vehicle.
Figure 3:
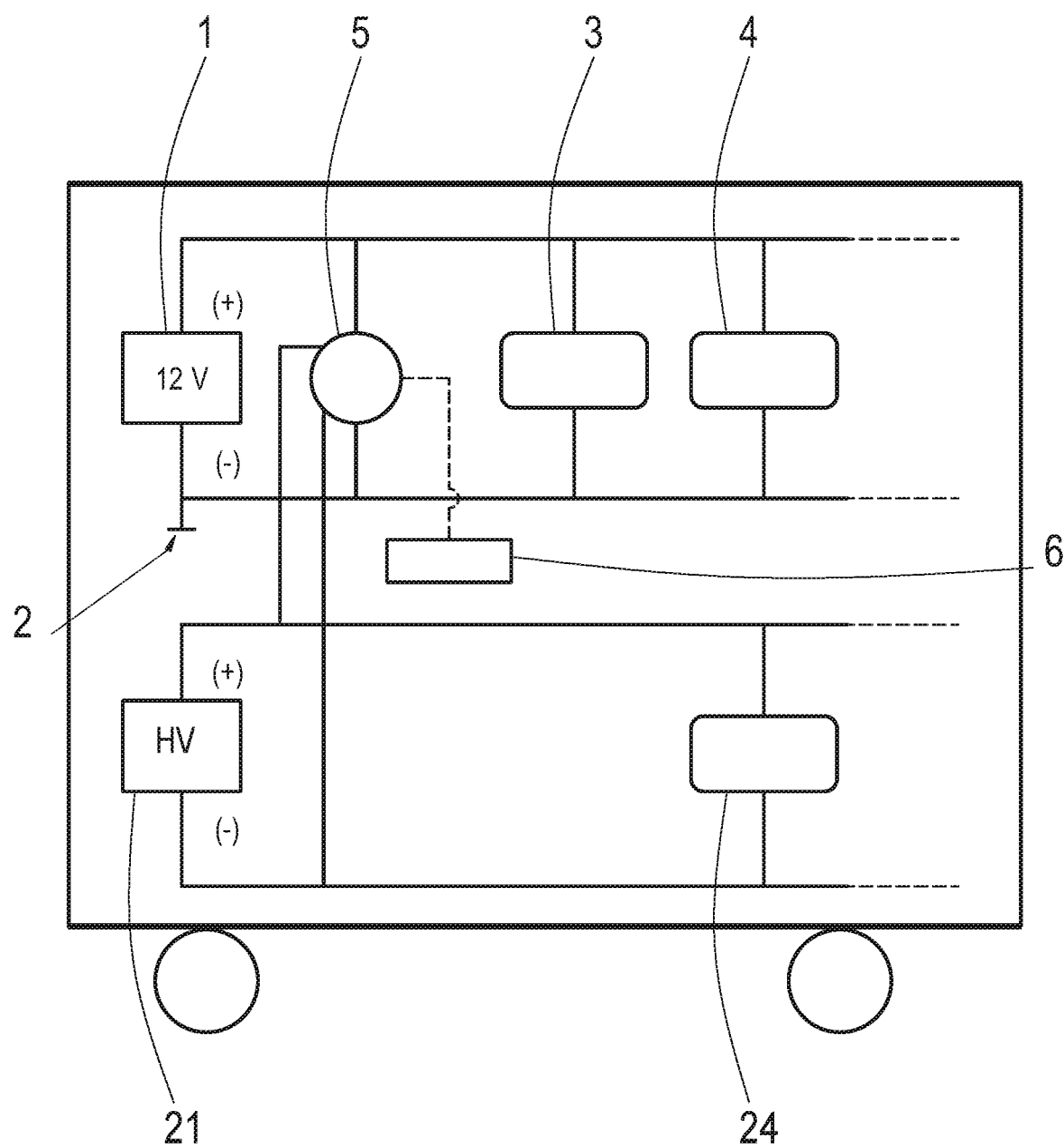
FIG. 3 shows yet another schematic representation of a motor vehicle.

As shown in FIGS. 2 and 3, in case the motor vehicle can be electrically driven at least some of the time, the motor vehicle on-board network can have a second voltage circuit that is preferably configured as a high voltage circuit. This second voltage circuit is then used to supply electric power to the electric traction drive 24 of the motor vehicle and has a corresponding second DC voltage source 21.

This second voltage circuit can then have a separate insulation monitor 25, as is shown in FIG. 2. In case the two voltage circuits are galvanically isolated from each other, instead of this a common insulation monitor 5 can also be used for both voltage circuits, as is shown in FIG. 3.

REFERENCE LIST

1 Voltage source
2 Motor vehicle chassis
3 Electric component, environment sensor system
4 Electric component
5 Insulation monitor
6 Motor vehicle master computer

The invention claimed is:

1. A motor vehicle on-board network comprising:
   a first low voltage DC circuit for supplying DC electric power to an environment sensor system with a first electrical DC voltage at or below 60 volts;
   a first insulation monitor for the first low voltage DC circuit configured to monitor an insulation resistance of the first low voltage DC circuit separately from a second high voltage DC circuit;
   the second high voltage DC circuit with a second electrical DC voltage above 60 volts for supplying DC electric power to an electric traction drive, wherein the second high voltage DC circuit is not galvanically isolated from the first low voltage DC circuit;
   a second insulation monitor that is independent of the first insulation monitor, the second insulation monitor to monitor an insulation resistance of the second high voltage DC circuit separately from the first low voltage DC circuit.

2. The motor vehicle on-board network according to claim 1, wherein the environment sensor system comprises at least one of a Light Detection and Ranging (LIDAR) sensor system, a Radio Ranging and Detection (RADAR) sensor system, an ultrasonic sensor system, or a camera.

3. A motor vehicle comprising a motor vehicle on-board network, the motor vehicle on-board network comprising:
   a first low voltage DC circuit for supplying DC electric power to an environment sensor system with a first electrical DC voltage at or below 60 volts;
   a first insulation monitor for the first low voltage DC circuit configured to monitor an insulation resistance of the first low voltage DC circuit separately from a second high voltage DC circuit;
   the second high voltage DC circuit with a second electrical DC voltage above 60 volts for supplying DC electric power to an electric traction drive, wherein the second high voltage DC circuit is not galvanically isolated from the first low voltage DC circuit; and a second insulation monitor that is independent of the first insulation monitor, the second insulation monitor configured to monitor an insulation resistance of the second high voltage DC circuit separately from the first low voltage DC circuit.

4. The motor vehicle on-board network according claim 3, wherein the environment sensor system comprises at least one of a Light Detection and Ranging (LIDAR) sensor system, a Radio Ranging and Detection (RADAR) sensor system, an ultrasonic sensor system, or a camera.

* * * * *